(12) United States Patent
Hassan

(10) Patent No.: US 7,664,213 B2
(45) Date of Patent: Feb. 16, 2010

(54) CLOCK ALIGNMENT DETECTION FROM SINGLE REFERENCE

(75) Inventor: Mahmudul Hassan, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 617 days.

(21) Appl. No.: 11/285,265

(22) Filed: Nov. 22, 2005

(65) Prior Publication Data

US 2007/0116164 A1    May 24, 2007

(51) Int. Cl.
*H04L 7/00*  (2006.01)
*G06F 1/04*  (2006.01)

(52) U.S. Cl. .................. 375/354; 327/291
(58) Field of Classification Search ........... 375/354; 327/291
See application file for complete search history.

(56) References Cited

U.S. PATENT DOCUMENTS

| | | | |
|---|---|---|---|
| 5,654,988 A * | 8/1997 | Heyward et al. | 375/355 |
| 5,694,556 A | 12/1997 | Neal et al. | |
| 6,044,207 A * | 3/2000 | Pecone et al. | 710/314 |
| 6,128,669 A | 10/2000 | Moriarty et al. | |
| 6,140,854 A * | 10/2000 | Coddington et al. | 327/158 |
| 6,194,969 B1 * | 2/2001 | Doblar | 331/2 |
| 6,226,704 B1 | 5/2001 | Wang et al. | |
| 6,320,436 B1 * | 11/2001 | Fawcett et al. | 327/158 |
| 6,748,039 B1 * | 6/2004 | Bates | 375/354 |
| 6,792,554 B2 * | 9/2004 | Gervais et al. | 713/600 |
| 7,084,685 B2 * | 8/2006 | Lin et al. | 327/291 |
| 2002/0047748 A1 * | 4/2002 | Fujita | 331/49 |
| 2006/0047459 A1 * | 3/2006 | Underbrink et al. | 702/117 |

OTHER PUBLICATIONS

Motorola, Inc., Semiconductor Technical Data, "Dynamic Switch PLL Clock Driver," Sep. 1997, pp. 1-6.

* cited by examiner

*Primary Examiner*—Mohammad H Ghayour
*Assistant Examiner*—Sarah Hassan
(74) *Attorney, Agent, or Firm*—Rory D. Rankin; Meyertons Hood Kivlin Kowert & Goetzel, P.C.

(57) ABSTRACT

A data communications system is disclosed. The data communications system comprises two clock domains. Each of the clock domains are coupled to receive a source clock signal. The first clock domain includes a first clock signal and the second clock domain includes a second clock signal, each of the first clock signal and the second clock signal are derived from the source clock signal. The first clock signal has a frequency which is different from that of the second clock signal, and which is not an integer multiple of the frequency of the second clock signal. The first clock domain includes circuitry which is configured to generate both the first clock signal and a reference clock signal derived from the source clock signal. The first clock domain is further configured to utilize the first clock signal to sample the reference clock signal, and assert an aligned signal responsive to detecting an edge of the reference clock signal, wherein the aligned signal indicates an edge of the first clock signal is aligned with an edge of the second clock signal.

9 Claims, 4 Drawing Sheets

CLOCK ALIGNMENT DETECTION FROM SINGLE REFERENCE

BACKGROUND OF THE INVENTION

1. Field of the Invention

This invention relates to multi-clock domain digital data communication and, more particularly, to detecting the alignment of multiple clock signals.

2. Description of the Related Art

New techniques to ensure the reliability of the communication of digital data have become necessary as the speed of communication links has increased. Particularly within computer memory systems, a reference clock may accompany parallel digital data so as to provide a mechanism for determining the appropriate time to sample the data. However, it is often the case that multiple clock domains are established within a given communications system due to the difficulties involved in distributing a single clock throughout a large system. Although the clocks of each individual clock domain may or may not have the same frequency, it is to be expected that the phase relationship between any two clocks in different domains will vary depending on changes in voltages and temperature between the domains over time. Jitter in the phase offset between a transmitting clock and a receiving clock tends to move the sampling point away from the ideal point in the received data signal, resulting in poor timing margins and/or a higher bit-error-rate (BER). The higher the speed at which a communications link is clocked, the more significant the effects of phase jitter become. In addition, if the ratio of the clock frequencies across a given boundary is not an integral multiple, determining when the respective clocks are aligned can be difficult. Therefore, it is desirable to have a mechanism to determine when to sample the data across a clock boundary while maintaining a robust timing margin thereby reducing the impact of phase changes between clock domains and enabling higher communication speeds.

It can be important to pick a point in time "deterministically" when one or more ratio'ed synchronous clocks are aligned, especially when it pertains to domain crossing between such clocks. "Ratio'ed synchronous" clocks have frequencies that are rational multiples of a single reference clock. This can happen when a single clock reference input to a chip is multiplied internally by one or more PLLs.

SUMMARY OF THE INVENTION

Various embodiments of a data communications system are disclosed. In one embodiment, the data communications system comprises two clock domains across which communications may occur. A first clock domain includes a first clock signal, and a second clock domain includes a second clock signal. In one embodiment, the first clock signal and the second clock signal are derived from a common source and have different frequencies. In one embodiment, the frequency of the first clock signal is not an integral multiple of the frequency of the second clock signal.

In one embodiment, the system comprises circuitry which is configured to determine when edges of the first clock signal are aligned with the second clock signal. In one embodiment, the first clock signal has a higher frequency than that of the second clock signal and is utilized to sample a reference clock signal which is derived from the common source. Responsive to detecting an edge of the reference clock signal, the circuitry generates a pre-alignment signal indicating such alignment has been detected. Responsive to the pre-alignment signal, a predetermined number of cycles of the first clock signal are counted to identify a cycle of the first clock signal which immediately precedes the next alignment of the first clock signal with the reference clock signal, and an alignment signal is asserted. During assertion of the alignment signal, the first clock signal will be aligned with the second clock signal.

Figure 1:
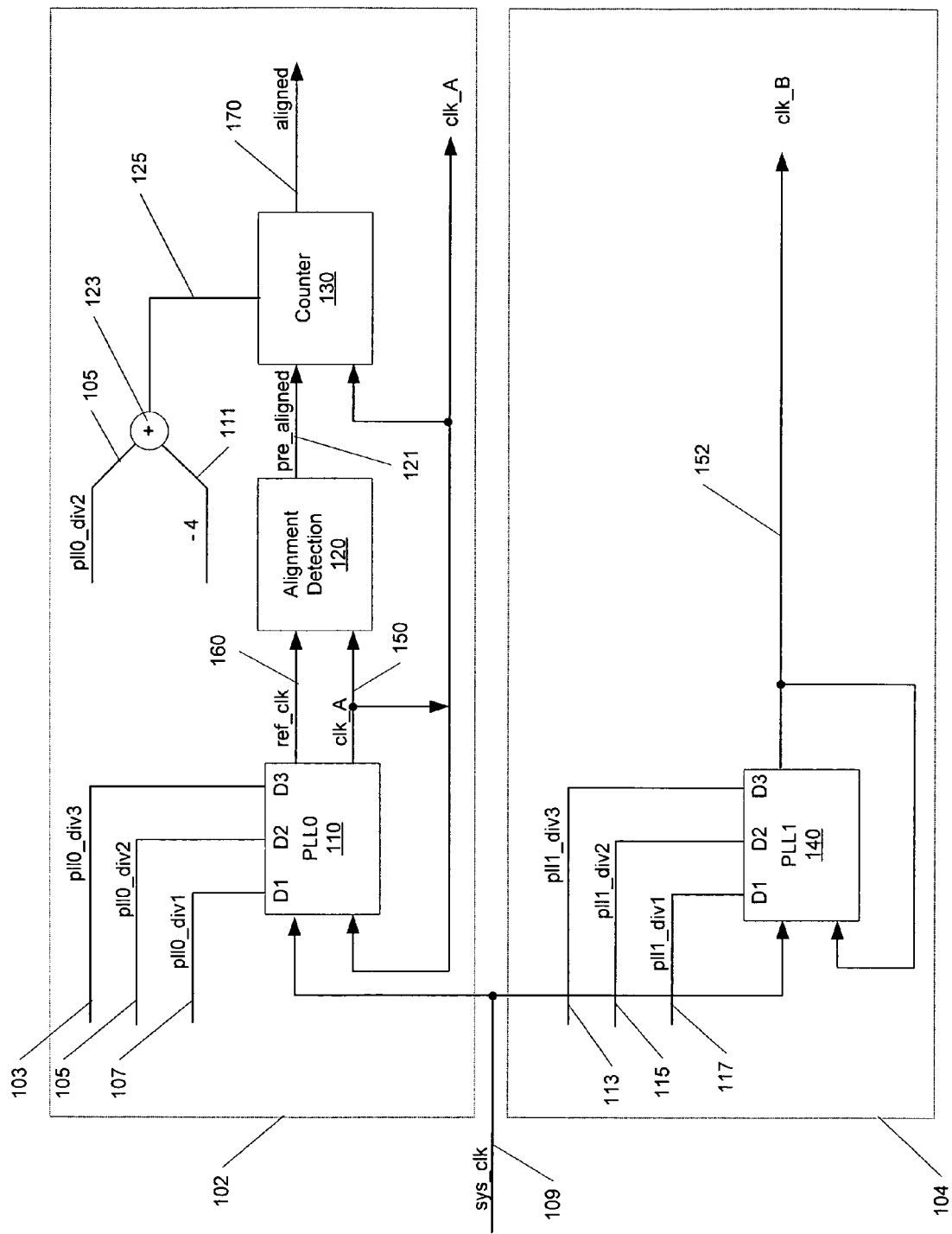
FIG. 1 depicts one embodiment of a system including two clock domains.

While the invention is susceptible to various modifications and alternative forms, specific embodiments are shown by way of example in the drawings and are herein described in detail. It should be understood, however, that drawings and detailed descriptions thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

FIG. 1 illustrates one embodiment of a system which includes multiple clock domains. In the example shown, a first clock domain is depicted as block 102 and a second clock domain is depicted as block 104. Within each of the domains 102 and 104, circuitry is included which is configured to generate a clock signal within the respective domain. For example, domain 102 includes circuitry configured to generate clk_A 150, and domain 104 includes circuitry configured to generate clk_B 152. As depicted in FIG. 1, each domain 102 and 104 receives a common source clock signal sys_clk 109.

In one embodiment, both clk_A 150 and clk_B 152 are derived from the common clock source sys_clk 109. The sys_clk 109 may be used to generate a reference clock signal, ref_clk 160, and each of clk_A 150 and clk_B 152 may be multiples of ref_clk 160. In one embodiment, clk_A 150 is N×ref_clk 160, and clk_B 152 is M×ref_clk 160. Consequently, a rising edge of clk_A 150 will align with a rising edge of ref_clk 160 every N cycles of clk_A 150, and a rising edge of clk_B 152 will align with a rising edge of ref_clk 160 every M cycles of clk_B 152. Further, the ratio of clk_A 150 to clk_B 152 in such an embodiment may be N:M. In an embodiment wherein data and/or signals cross between clock domain 102 and clock domain 104, it may be necessary to determine when clk_A 150 and clk_B 152 are aligned. However, given clk_A 150 and clk_B 152 may have different frequencies, determining when both clock signals are aligned may pose some difficulty. In particular, when the frequency of one clock signal to another is not an integral multiple, the difficulty of determining when a rising edge of one clock signal is aligned with the other may be increased.

FIG. 1 illustrates one embodiment of a system configured to generate an alignment signal 170 which may be used to indicate alignment of clk_A 150 and clk_B 152. In the embodiment shown, each clock domain 102 and 104 includes a phase locked loop (PLL) for use in generating clock signals. Domain 102 includes a PLL0 110 coupled to receive sys_clk 109, and domain 104 includes PLL1 140 coupled to receive sys_clk 109. Each of PLL0 110 and PLL1 140 are configured to generate clock signals which are derived from sys_clk 109.

It is to be understood that a variety of ways of generating clock signals from a source clock signal are possible and are contemplated. The examples described herein are intended to be illustrative and are not intended to be limited to the particular examples provided.

In the example shown, each of PLL0 110 and PLL1 140 are identical but programmable. In other embodiments, PLL0 110 and PLL1 140 may not be identical. For example, PLL0 110 is programmable via signals pll0_div1 107, pll0_div2 105, and pll0_div3 103. Similarly, PLL1 140 may be programmable via signals pll1_div1 117, pll1_div2 115, and pll1_div3 113. Based upon values of these signals, the respective PLL may generate a clock signal with a different frequency. As illustrated, PLL0 110 is configured to generate ref_clk signal 160 and clk_A 150. Clock signal clk_A 150 may then be used as a clock source for other circuitry (including circuitry and components not shown) within domain 102. In a similar manner, PLL1 140 generates a signal clk_B 152 that may be used within domain 104.

In addition to the above, domain 102 further includes alignment detection circuitry 120 coupled to receive ref_clk 160 and clk_A 150, and which is configured to generate a pre_aligned signal 121 which may be used to further identify alignment between clk_A 150 and clk_B 152. In one embodiment, clk_A 150 is used to sample ref_clk 160 and circuitry 120 is configured to assert pre_aligned signal 121 when a rising edge of ref_clk 160 is detected. In an embodiment where clk_A 150 is N×ref_clk 160, detection of a rising edge of ref_clk 160 may then indicate that a rising edge of ref_clk 160 and clk_A 150 will again occur in N cycles of clk_A 150. Further, in an embodiment wherein clk_B 152 is also derived from sys_clk 109 and is generated at a frequency of M×ref_clk 160, the detection of the rising edge of ref_clk 160 will also indicate a rising edge of clk_B 152 will occur N cycles of clk_A 150 after the detected rising edge of ref_clk 160. In other words, a rising edge of all of ref_clk 160, clk_A 150, and clk_B 152 will occur N cycles of clk_A 150 after detection of the rising edge of ref_clk 160. Accordingly, alignment between clk_A 150 and clk_B 152 may be determined. It is noted that while the detection of a rising edge are described herein, those skilled in the art will appreciate that the methods and mechanisms described herein may be modified to detect and utilize falling edges in alternative embodiments. All such alternatives are contemplated.

In one embodiment, alignment circuitry 120 may be configured such that three cycles of clk_A 150 may elapse between the time a rising edge of ref_clk 160 is detected and the time pre_aligned signal 121 is asserted. Accordingly, a next rising edge of clocks 160, 150, and 152 will occur in N−3 cycles of clk_A 150. As shown in FIG. 1, an adder 123 may be utilized to calculate a difference between N and the four cycles which have already elapsed. In one embodiment, N−4 is used so as to assert the aligned signal 170 immediately prior to the alignment of the clock edges. In the embodiment shown, signal pll0_div2 105 may represent N and may be coupled as an input to adder 123 along with a signal 111 whose value is −4. The resulting signal 125 may then be used by a counter 130 or other device to shift the pre_aligned signal 121 in time by N−4 cycles of clk_A 150. The aligned signal 170 is then asserted at the N−4 cycles later to indicate alignment of the rising edges of clk_A 150 and clk_B 152. It is noted that the depicted adder is symbolic, and those skilled in the art will appreciate there are numerous ways the equivalent value may be achieved. For example, mapping a set of values N to N−4 could be used. All such alternatives are contemplated.

Figure 2:
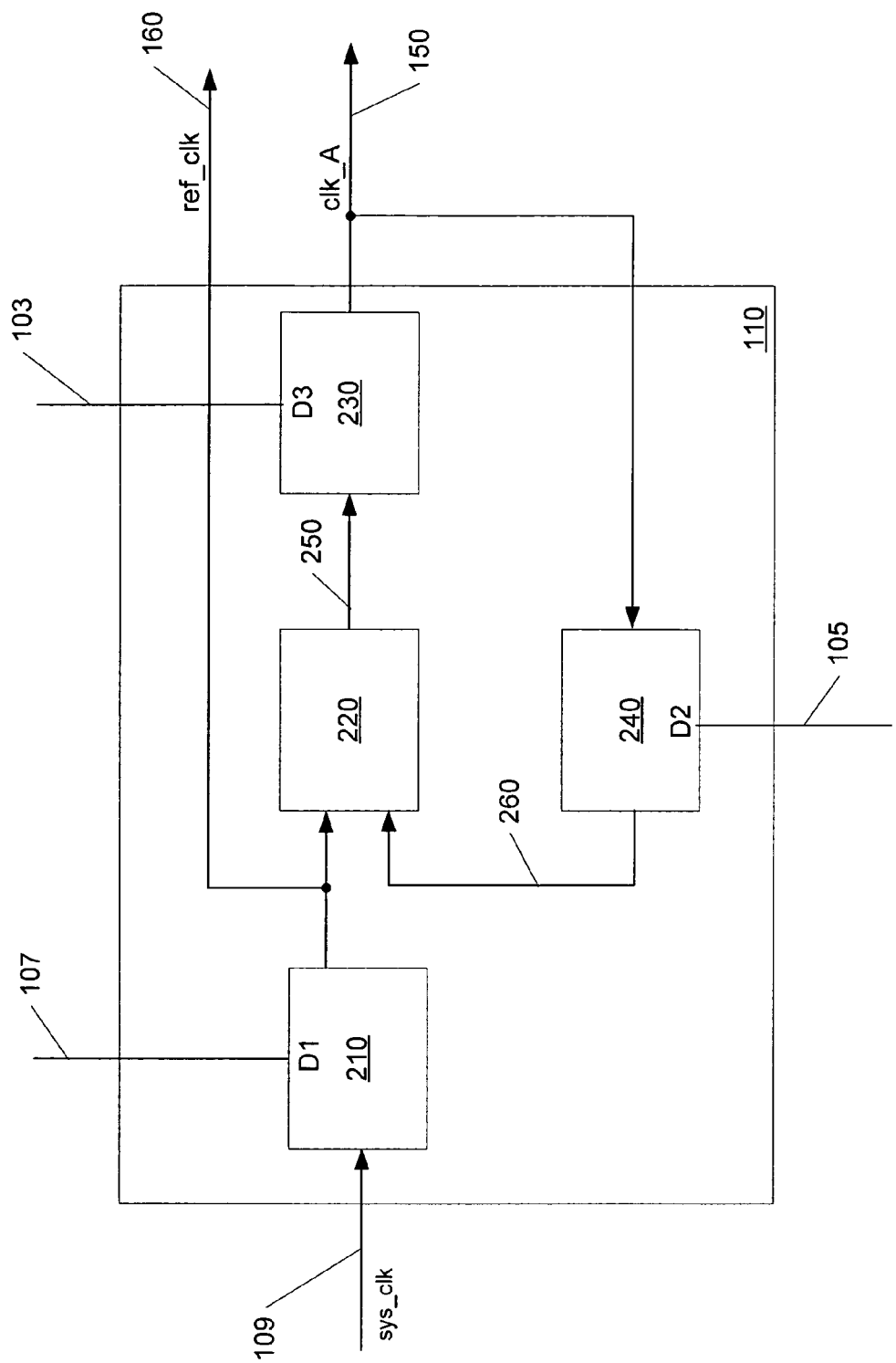
FIG. 2 illustrates one embodiment of a phase locked loop.

FIG. 2 depicts one embodiment of PLL0 110. PLL1 140 may be similarly configured. However, as noted above, numerous alternative confirmations are possible and are contemplated. In the example shown, PLL0 110 includes frequency divider circuits 210, 230, and 240. Also includes is commonly utilized PLL circuitry 220 which may include a phase frequency detector, loop filter, voltage controlled oscillator, and/or other suitable circuitry. In one embodiment, circuit 210 is configured to divide a received sys_clk 109 by a value indicated by signal 107 (D1). For example, circuit 210 may divide sys_clk 109 by two to generate a ref_clk 160 which is half the frequency of sys_clk 109. Circuitry 220 is coupled to receive ref_clk 160 and multiply the received clock signal 160 by a factor of N as described above to generate a clock signal 250. Circuitry 230 may then be configured to divide clock signal 250 by a value indicated by signal 103 (D3). Assuming, for purposes of discussion, that circuit 230 performs a divide by one, clock signal 250 generally represents clk_A 150. The signal clk_A 150 may then be fed back into circuit 220 to generate a phase locked signal. In the embodiment shown, clk_A 150 may be fed back via a frequency divider circuit 240 which may first divide the frequency of clk_A 150 prior to feeding it back in to circuit 240 as clock signal 260. For example, in one embodiment, circuit 240 may be programmed via signal 105 (D2) to perform a division by two.

Figure 3:
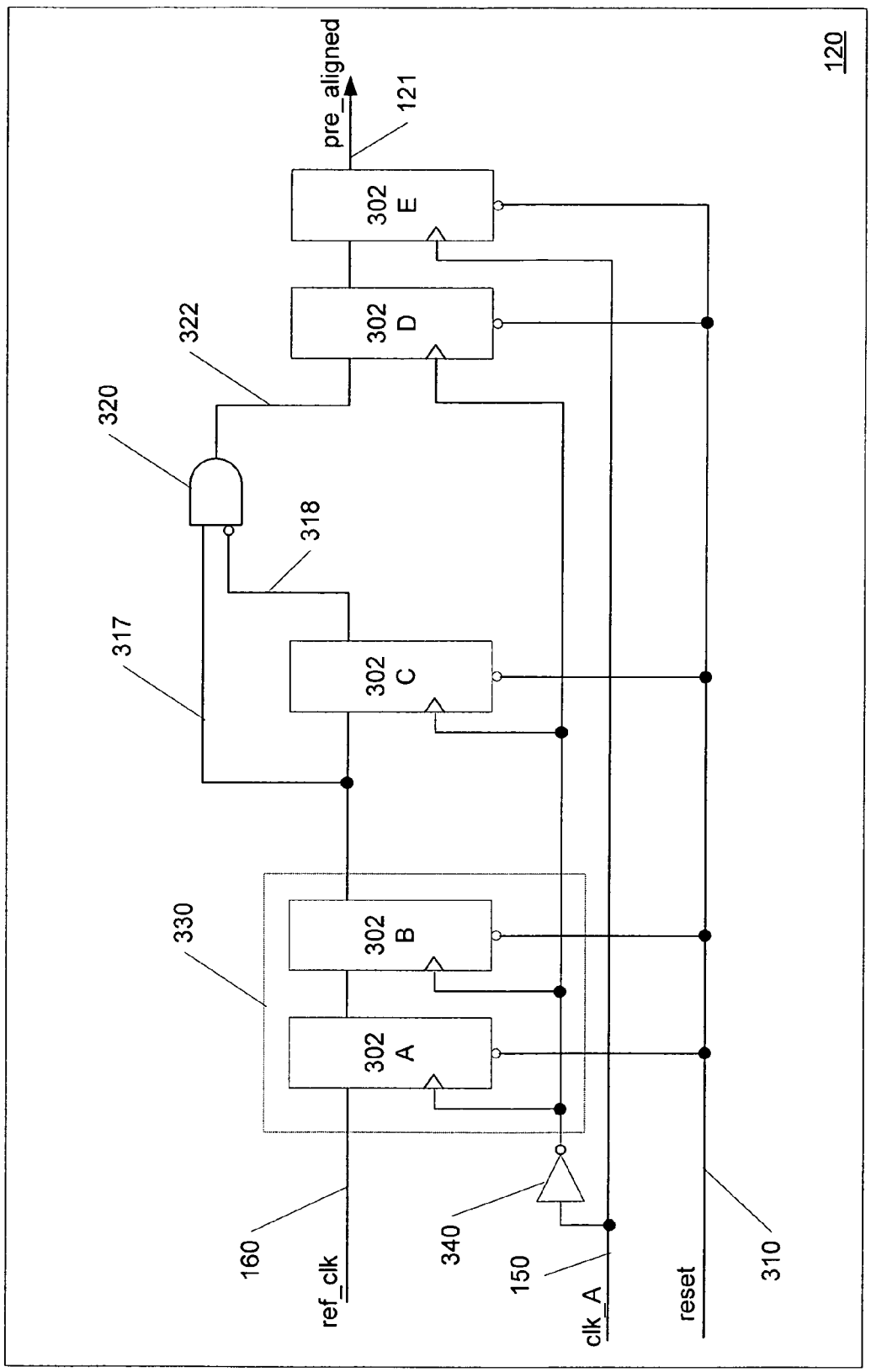
FIG. 3 illustrates one embodiment of circuitry configured to generate an alignment related signal.

Turning now to FIG. 3, one embodiment of alignment detection circuitry 120 is shown. In the embodiment shown, five flip-flops 302A-302E are included in circuitry 120, with each coupled to a reset signal 310 which may be used to reset the state of each flip-flop as desired. As used herein, elements referred to herein with a particular reference number followed by a letter may be collectively referred to by the reference number alone. For example, flip-flops 302A-302E may be collectively referred to as flip-flops 302. In addition, clk_A 150 is shown coupled as clock input to flip-flop 302E. An inverter 340 receives as input clk_A 150 and conveys the inverted value as clock input to each of flip-flops 302A-302D.

In an embodiment as described above, clk_A 150 has a frequency which is a multiple of that of ref_clk 160. A first flip-flop 302A is coupled to receive as data input ref_clk 160. The flip-flop 302A is also coupled to receive as clock input an inverted clk_A 150. Accordingly, flip-flop 302A may be configured to latch the value of ref_clk 160 on each falling edge of clk_A 150. The output of flip-flop 302A is coupled as input to flip-flop 302B, whose output is coupled as input to flip-flop 302C and logic AND gate 320. The output of logic AND gate 320 is coupled as input to flip-flop 302D, whose output is coupled as input to flip-flop 302D. Finally, the state/output of flip-flop 302E is conveyed as pre_aligned signal 121.

As seen in the embodiment of FIG. 3, pre_aligned signal 121 is asserted only when an asserted signal 322 has been latched into flip-flip 302D and conveyed to flip-flop 302E. As logic AND gate 320 includes one inverted 318 and one non-inverted 317 input, the output 322 of gate 320 will be asserted only when input 317 is asserted and input 318 is negated. Consequently, the state of flip-flop 302C must be a binary zero, while the state of flip-flop 302B must be a binary one. In order for flip-flop 302C to have a state of binary zero, and flip-flop 302B to have a state of binary zero, clk_A 150 must have sampled a 0-1 sequence of values for ref_clk 160, which serves to indicate a rising edge of ref_clk 160 has been sampled. In the embodiment shown, a synchronizer block 330 is shown to include two flip-flops 302A-302B. This sequence of two flip-flops 302A-302B may serve to reduce the likelihood of metastability during a 1-0 transition, a "don't care condition". However, should metastability occur, an entire clk_A 150 clock period may be provided for possible metastable events in flip-flop 302A to resolve themselves without altering the "low" state of the pre-aligned signal 121. During the 0-1 transition of interest, a half-cycle guard band on either side is provided against the possibility of metastability. Those skilled in the art will appreciate that a synchronizer block 330 is not necessarily required for dealing with metastability, for example, when N is restricted to be an even integer. However, in one embodiment, a synchronizer block 330 may be used.

When a rising edge of ref_clk 160 is detected (i.e., a 0-1 sequence is properly latched), the latching of the "1" in flip-flop 302A on the falling edge of clk_A 150 indicates the rising edge of ref_clk 160 occurred on the prior rising edge of clk_A 160 (i.e., one half cycle of clk_A 150 earlier). Further, there are 2½ cycles of clk_A 150 latency from the time the "1" is latched into flip-flop 302A to the time pre_aligned signal 121 is asserted—or 3 clk_A 150 cycles between the time of the rising edge of ref_clk 160 and the assertion of pre_aligned signal 121. Accordingly, three cycles of clk_A 150 are consumed by alignment circuit 120 in detecting and indicating a rising edge of ref_clk 160. In the example, the counter has an additional cycle of latency once the count reaches a specific value. Therefore, when determining when the next rising edge of ref_clk 160 is to occur, these four cycles may be taken into account. For example, if clk_A 150 has a frequency that is 9 times the frequency of ref_clk 160, then a rising edge of ref_clk 160 may be determined to occur five cycles after the assertion of pre_aligned signal 121.

It is noted that alternative embodiments of alignment circuit 120 may consume greater than, or less than, three cycles of clk_A 150. In such alternative embodiments, these different latencies may be accounted for as appropriate. Having received the pre-aligned signal 121, a counter circuit 130 as depicted in FIG. 1 may be used to assert the aligned signal 170 the appropriate number of cycles following assertion of the pre_aligned signal 121.

Figure 4:
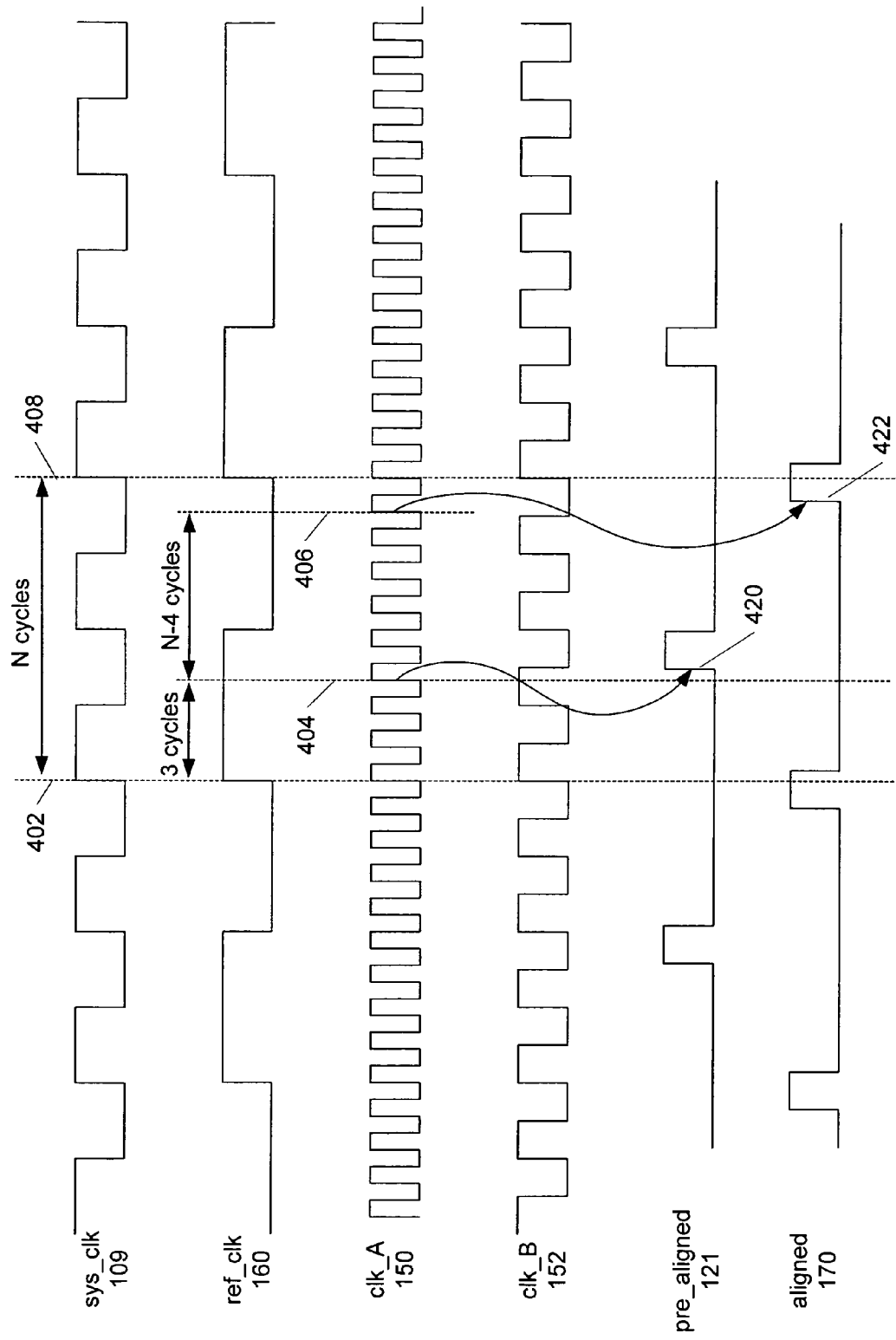
FIG. 4 depicts one embodiment of a timing diagram.

FIG. 4 shows a timing diagram corresponding to one embodiment of the system of FIG. 1. In the example shown, signals for sys_clk 109, ref_clk 160, clk_A 150, clk_B 152, pre_aligned 121, and aligned 170 are shown. In this embodiment, ref_clk 160 is half the frequency of sys_clk 109. The clk_A signal 150 is nine times the frequency of ref_clk 160, and clk_B 152 is four times the frequency of ref_clk 160. Utilizing the embodiment of alignment circuit 120, a rising edge of ref_clk 160 is detected at a time 402. Three cycles of clk_A 150 later at time 404, clk_A 150 latches the asserted value into flip-flop 302E and the pre_aligned signal 121 is asserted as indicated by causation arrow 420. Assuming N equals nine, it may be determined that a next rising edge of ref_clk 160, and hence clk_A 150 and clk_B 152 as well, will occur six cycles of clk_A 150 after time 404. Therefore, the aligned signal 170 is asserted at time 406 five clk_A 150 cycles after time 40, as shown by causation arrow 422. Therefore, the next rising edge of clk_B 152 will be aligned with a rising edge of clk_A, and data and/or signals may be effectively communicated between the two clock domains.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data communications system comprising:
   a source clock signal;
   a first clock domain comprising a first clock signal which is derived from the source clock signal, wherein the first clock signal has a first frequency; and
   a second clock domain comprising a second clock signal which is derived from the source clock signal, wherein the second clock signal has a second frequency which is different from the first frequency, and wherein both the first frequency and the second frequency are an integer multiple of a frequency of the reference clock signal, and the first frequency is not an integer multiple of the second frequency;
   wherein the first clock domain includes circuitry which is configured to:
      generate a reference clock signal derived from the source clock signal;
      generate the first clock signal;
      utilize the first clock signal to sample the reference clock signal;
      assert an aligned signal responsive to detecting an edge of the reference clock signal, wherein the aligned signal indicates an edge of the first clock signal is aligned with an edge of the second clock signal;
      sample said reference clock signal on each falling edge of the first clock signal;
      detect a sequence wherein said reference clock signal is low on a first cycle of the first clock signal, and said reference clock signal is high on a cycle of the first clock signal immediately following the first cycle; and
      assert a pre-aligned signal which indicates a rising edge of the reference clock signal has been detected, responsive to detecting said sequence.

2. The system as recited in claim 1, wherein said circuitry is further configured to assert the aligned signal a predetermined number of cycles of the first clock signal subsequent to assertion of the pre-aligned signal.

3. The system as recited in claim 2, wherein the reference clock signal has a frequency which is half that of the source clock signal.

4. An apparatus comprising:
   a clock circuit coupled to receive a source clock signal, wherein the clock circuit is configured to:
      generate a first clock signal which is derived from the source clock signal, wherein the first clock signal has a first frequency; and
      generate a reference clock signal derived from the source clock signal, wherein the reference clock signal has a frequency different than the first frequency;
   an alignment detection unit coupled to receive the reference clock signal and the first clock signal, wherein the alignment detection unit is configured to:
      utilize the first clock signal to sample the reference clock signal; and
      generate a signal indicative of an alignment between an edge of the first clock signal and an edge of a second clock signal which is derived from the source clock signal, and wherein the second clock signal has a frequency different than the first frequency, and wherein both the first frequency and the second frequency are an integer multiple of a frequency of the reference clock signal, and the first frequency is not an integer multiple of the second frequency;
      sample the reference clock signal on each falling edge of the first clock signal;

detect a sequence wherein said reference clock signal is low on a first cycle of the first clock signal, and said reference clock signal is high on a cycle of the first clock signal immediately following the first cycle; and assert a pre-aligned signal which indicates a rising edge of the reference clock signal has been detected, responsive to detecting said sequence.

5. The apparatus as recited in claim 4, further comprising a counter unit configured to assert an aligned signal a predetermined number of cycles of the first clock signal subsequent to assertion of the pre-aligned signal.

6. The apparatus as recited in claim 5, wherein the reference clock signal has a frequency which is half that of the source clock signal.

7. A method for determining of alignment of clock signals comprising:

receiving a source clock signal in a first clock domain and a second clock domain;

generating a first clock signal from the source clock signal in the first clock domain, wherein the first clock signal has a first frequency; and generating a reference clock signal from the source clock signal in the first clock domain;

generating a second clock signal in the second clock domain, wherein the second clock signal is derived from the source clock signal, and wherein the second clock signal has a second frequency which is different from the first frequency, wherein both the first frequency and the second frequency are an integer multiple of a frequency of the reference clock signal, and the first frequency is not an integer multiple of the second frequency;

utilizing the first clock signal to sample the reference clock signal; and asserting an aligned signal responsive to detecting an edge of the reference clock signal, wherein the aligned signal indicates an edge of the first clock signal is aligned with an edge of the second clock signal;

sampling the reference clock signal on each falling edge of the first clock signal;

detecting a sequence wherein said reference clock signal is low on a first cycle of the first clock signal, and said reference clock signal is high on a cycle of the first clock signal immediately following the first cycle; and asserting a pre-aligned signal which indicates a rising edge of the reference clock signal has been detected, responsive to detecting said sequence.

8. The method as recited in claim 7, further comprising asserting an aligned signal a predetermined number of cycles of the first clock signal subsequent to assertion of the pre-aligned signal.

9. The method as recited in claim 8, wherein the reference clock signal has a frequency which is half that of the source clock signal.

* * * * *

UNITED STATES PATENT AND TRADEMARK OFFICE
CERTIFICATE OF CORRECTION

PATENT NO. : 7,664,213 B2
APPLICATION NO. : 11/285265
DATED : February 16, 2010
INVENTOR(S) : Mahmudul Hassan It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1068 days.

Signed and Sealed this

Thirtieth Day of November, 2010

David J. Kappos
*Director of the United States Patent and Trademark Office*